US009159400B2

(12) United States Patent
Ferrant et al.

(10) Patent No.: US 9,159,400 B2
(45) Date of Patent: Oct. 13, 2015

(54) SEMICONDUCTOR MEMORY HAVING STAGGERED SENSE AMPLIFIERS ASSOCIATED WITH A LOCAL COLUMN DECODER

(75) Inventors: Richard Ferrant, Esquibien (FR); Gerhard Enders, Olching (DE); Carlos Mazure, Bernin (FR)

(73) Assignee: Soitec, Bernin (FR)

( * ) Notice: Subject to any disclaimer, the term of this patent is extended or adjusted under 35 U.S.C. 154(b) by 798 days.

(21) Appl. No.: 13/422,697

(22) Filed: Mar. 16, 2012

(65) Prior Publication Data

US 2012/0243360 A1    Sep. 27, 2012

(30) Foreign Application Priority Data

Mar. 18, 2011  (FR) ...................................... 11 52256

(51) Int. Cl.
*G11C 7/06*   (2006.01)
*G11C 11/4091*   (2006.01)
*G11C 11/4097*   (2006.01)

(52) U.S. Cl.
CPC ............ *G11C 11/4091* (2013.01); *G11C 7/065* (2013.01); *G11C 11/4097* (2013.01)

(58) Field of Classification Search
CPC . G11C 11/4091; G11C 7/065; G11C 11/4097
USPC .......... 365/230.06, 185.21, 205, 207
See application file for complete search history.

(56) References Cited

U.S. PATENT DOCUMENTS 4,546,457 A * 10/1985 Nozaki et al. ................... 365/51
4,586,171 A * 4/1986 Fujishima ...................... 365/63
4,903,344 A    2/1990 Inoue ............................... 365/51
5,666,324 A * 9/1997 Kosugi et al. ............ 365/233.11
5,691,933 A    11/1997 Takenaka ........................ 365/63

(Continued)

FOREIGN PATENT DOCUMENTS

EP         2 372 716 A1    10/2011
JP         H02-123596 A     5/1990

(Continued)

OTHER PUBLICATIONS

Jei-Hwan Yoo, et al., "A 32-Bank 1Gb Self-Strobing Synchronous DRAM with 1GByte/s Bandwidth", IEEE Journal of Solid-State Circuits vol. 31, No. 11, pp. 1635-1644.*

(Continued)

*Primary Examiner* — Vanthu Nguyen
*Assistant Examiner* — Khamdan Alrobaie
(74) *Attorney, Agent, or Firm* — Jeffrey T. Holman

(57) ABSTRACT

A semiconductor memory having bit lines and wordlines crossing each other, a memory cell array formed by memory cells arranged in rows and columns on crossover points of the bit lines and wordlines, and sense amplifier banks arranged on opposite sides of the memory cell array. Each sense amplifier bank has staggered sense amplifiers connected to a bit line according to an interleaved arrangement whereby bit lines alternate in the direction of the wordlines between bit lines coupled to different sense amplifiers. This results in interconnect spaces parallel to the bit lines. Also, each sense amplifier bank includes a local column decoder for selecting a sense amplifier and which is staggered with the sense amplifiers and coupled to the sense amplifier by an output line running in an available interconnect space parallel to the bit lines.

20 Claims, 7 Drawing Sheets

(56) References Cited

U.S. PATENT DOCUMENTS

| | | | |
|---|---|---|---|
| 5,822,268 A * | 10/1998 | Kirihata | 365/230.03 |
| 5,859,805 A | 1/1999 | Takashima et al. | 365/205 |
| 5,923,607 A * | 7/1999 | Suh | 365/230.03 |
| 5,995,427 A * | 11/1999 | Tsukikawa | 365/201 |
| 6,151,263 A * | 11/2000 | Kyung et al. | 365/230.03 |
| 6,538,946 B2 | 3/2003 | Arai et al. | 365/206 |
| 6,639,822 B2 | 10/2003 | Fujisawa et al. | |
| 7,474,550 B2 | 1/2009 | Fujisawa et al. | |
| 7,525,829 B2 | 4/2009 | Kawakita et al. | |
| 2002/0000822 A1* | 1/2002 | Tomishima | 324/763 |
| 2002/0003738 A1 | 1/2002 | Arai et al. | 365/206 |
| 2002/0027826 A1* | 3/2002 | Cho | 365/230.06 |
| 2002/0054501 A1* | 5/2002 | Honigschmid et al. | 365/145 |
| 2006/0098469 A1* | 5/2006 | Yang et al. | 365/63 |
| 2008/0231360 A1 | 9/2008 | Milia et al. | 330/250 |
| 2011/0001108 A1* | 1/2011 | Greene et al. | 257/2 |
| 2011/0242926 A1* | 10/2011 | Mazure et al. | 365/230.06 |

FOREIGN PATENT DOCUMENTS

| | | |
|---|---|---|
| JP | H03-108750 A | 5/1991 |
| JP | H04-252491 A | 9/1992 |
| JP | H05-182457 A | 7/1993 |
| JP | H06-162771 A | 6/1994 |
| JP | H06-275826 A | 9/1994 |
| JP | H08-172169 A | 7/1996 |
| JP | 2002-026294 A | 1/2002 |

OTHER PUBLICATIONS

Search Report, application No. FR 1152256, dated Nov. 1, 2011.

* cited by examiner

SEMICONDUCTOR MEMORY HAVING STAGGERED SENSE AMPLIFIERS ASSOCIATED WITH A LOCAL COLUMN DECODER

FIELD OF THE INVENTION

The invention relates generally to a semiconductor memory, and more particularly to a Dynamic Random Access Memory (DRAM) wherein a local column decoder is associated with staggered sense amplifiers.

BACKGROUND OF THE INVENTION

Basically, a DRAM is an integrated circuit that stores data in binary form (e.g., "1" or "0") in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a wordline that interconnects cells on the row with a common control signal. Similarly, each column includes a bit line that is coupled to at most one cell in each row. Thus, the word and bit lines can be controlled so as to individually access each cell of the array.

To read data out of a cell, the capacitor of a cell is accessed by selecting the wordline associated with the cell. A complementary bit line that is paired with the bit line for the selected cell is equilibrated to an equilibrium voltage. This equilibration voltage (Veq) is typically midway between the high Vdd and low Vss (typically ground) logic levels. Thus, conventionally, the bit lines are equilibrated to one-half of the power supply voltage, Vdd/2. When the wordline is activated for the selected cell, the capacitor of the selected cell discharges the stored voltage onto the bit line, thus changing the voltage on the bit line. A differential amplifier, conventionally referred to as a sense amplifier, is then used to detect and amplify the difference in voltage on the pair of bit lines.

FIG. 1 represents a conventional memory architecture wherein in order to correctly read a data item from a memory cell of a memory array, a current read from a cell of an addressed memory matrix $A_M$ is compared at a sense amplifier SA0-SA7 of a sense amplifier array SAA to a current read from a cell of a reference memory matrix $R_M$ that serves in particular to compensate for unknown offset values that are due to irregularities in the fabrication process.

In order to reduce the surface area of a memory, a stacking technique, so-called "staggering" technique, is conventionally used to take into account the pitch difference in between the sense amplifier and the cells. Several sense amplifiers SA0-SA7, generally 4 or 8 as shown in FIG. 1, are therefore staggered one behind each other in the longitudinal direction of the bit lines, such as the bit lines $BL_2$ and $bBL_2$ (complementary to $BL_2$) coupled to sense amplifier SA2.

The architecture of FIG. 1 is disadvantageous in that a bit line and its complementary run over all the staggered sense amplifiers. This leads to a congestion of the space available as metal-0 (metal used for the bit lines) indeed covers 100% of the sense amplifiers.

Moreover, addressing a specific cell of the memory necessitates row and column address buses built from metal tracks, generally metal-1 tracks. When 64 column address buses are used to decode the sense amplifiers of the sense amplifier array, around 100 metal-1 tracks need to be present for power supplies, control commands, I/Os and decoding (64 tracks for this latest group). But in the near future, there needs to be much more focus of the core circuits of a DRAM, especially on the sense amplifier. Indeed, with introduction of Fully Depleted Silicon On Insulator (FDSOI) technology or introduction of high-k/metal gate, devices will get smaller and the metal lines would likely become the limiting factor, not any more the size of the devices. It is therefore understood that 100 metal-1 tracks are far too many for such smaller devices.

FIG. 2 shows another memory architecture that helps limiting the available space congestion. In this architecture, the sense amplifiers array is split into pairs of staggered sense amplifier banks SABe, SABo and the bit lines adopt an interleaved arrangement whereby bit lines alternate in the lateral direction of the wordlines WL between a bit line BL0, bBL0, BL2, bBL2 coupled to a sense amplifier SA0, SA2 of the first bank SAB0 of the pair and a bit line BL1, bBL1 coupled to a sense amplifier SA1 of the second bank SAB1 of the pair. The alternative arrangement of the bit lines result in interconnect spaces available in each sense amplifier bank of the pair parallel to the bit lines. Taking bank SABe as an example, interconnect space is available in between bit lines BL0, bBL0 and bit lines BL2, bBL2. Taking bank SABo as an example, interconnect space is available before bit lines BL1, bBL1. With this alternative arrangement, metal-0 now covers only 50% of the sense amplifiers. With relaxed constraints on the sense amplifiers, the layout is easier.

On the other hand, this architecture necessitates dividing the memory cells array into sub-arrays, which results on the top and bottom sub-arrays being only half-used. Moreover, when 64 column address buses CAB are used (32 buses dedicated to each of the sense amplifier sections), around 140 metal-1 tracks needs to be drawn (around 70 per sense amplifier section). The architecture of FIG. 2 therefore also suffers from the high number of column address buses.

Accordingly, there is a need for improved memory architectures and these are now provided by the present invention.

SUMMARY OF THE INVENTION

The invention thus provides a semiconductor memory that does not suffer from the above mentioned drawbacks, and in particular relates to a semiconductor memory necessitating less column address buses. In this regard, the invention proposes, in general, a semiconductor memory comprising: a plurality of bit lines and a plurality of wordlines crossing each other, a memory cell array formed by a plurality of memory cells arranged in rows and columns on crossover points of the bit lines and wordlines, at least one pair of sense amplifier banks, wherein the sense amplifier banks of a pair are arranged on opposite sides of the memory cell array. Also, each sense amplifier bank of a pair comprises a plurality of sense amplifiers staggered in the longitudinal direction of the bit lines, with each sense amplifier being connected to a corresponding bit line according to an interleaved arrangement whereby bit lines alternate in the lateral direction of the wordlines between a bit line coupled to a sense amplifier of the first bank of the pair and a bit line coupled to a sense amplifier of the second bank of the pair. This alternative arrangement of bit lines results in interconnect spaces available in each sense amplifier bank of the pair parallel to the bit Advantageously, each sense amplifier bank further comprises at least one local column decoder for selecting at least one sense amplifier of the sense amplifier bank, with the local column decoder being staggered with the sense amplifiers and being coupled to the at least one sense amplifier of the sense amplifier bank by means of an output line running in an available interconnect space parallel to the bit lines.

Other preferred, although non limitative, aspects of this memory architecture are as follows:

- each sense amplifier bank comprises a single local column decoder coupled to each sense amplifier of the sense amplifier bank.
- each sense amplifier bank comprises a plurality of local column decoders.
- the local column decoder is a NOR gate or a NAND gate.
- the local column decoder comprises a plurality of decoder sections, each decoder section being coupled to respective sense amplifiers of the sense amplifier bank.
- the sense amplifier banks are implemented on a semiconductor-on-insulator substrate and a decoder section comprises a pseudo-inverter structure having two complementary double-gate transistors in series between a first input of the decoder section and the ground, each double-gate transistor having a first gate and a second gate, the first gates of the transistors being both coupled to a second input of the decoder section while the second gates of the transistors are both coupled to the complementary of the first input, an output of the decoder section out being provided at the middle-point of the serial association of the two transistors.
- a first input of the local column decoder is connected to a first column address bus by means of a first input line, a second input of the local column decoder is connected to a second column address bus by means of a second input line, and both the first and the second input lines run in an available interconnect space.
- the first input line is a metal-0 line and the first column address bus is a metal-1 bus.
- the second input line is a metal-0 line and the second column address bus is a metal-1 bus.
- the second input line is a metal-0 line, and the second column address bus comprises a metal-2 bus running in the longitudinal direction of the bit lines and a metal-1 bus coupled to the metal-2 bus, the metal-1 bus running in the transversal direction of the wordlines.

BRIEF DESCRIPTION OF THE DRAWINGS

Other aspects, goals and advantages of the invention will become more apparent upon reading the following detailed description of preferred embodiments thereof, given by way of examples and with reference to the accompanying drawings upon which.

DETAILED DESCRIPTION OF THE PREFERRED EMBODIMENTS OF THE INVENTION

Figure 3:
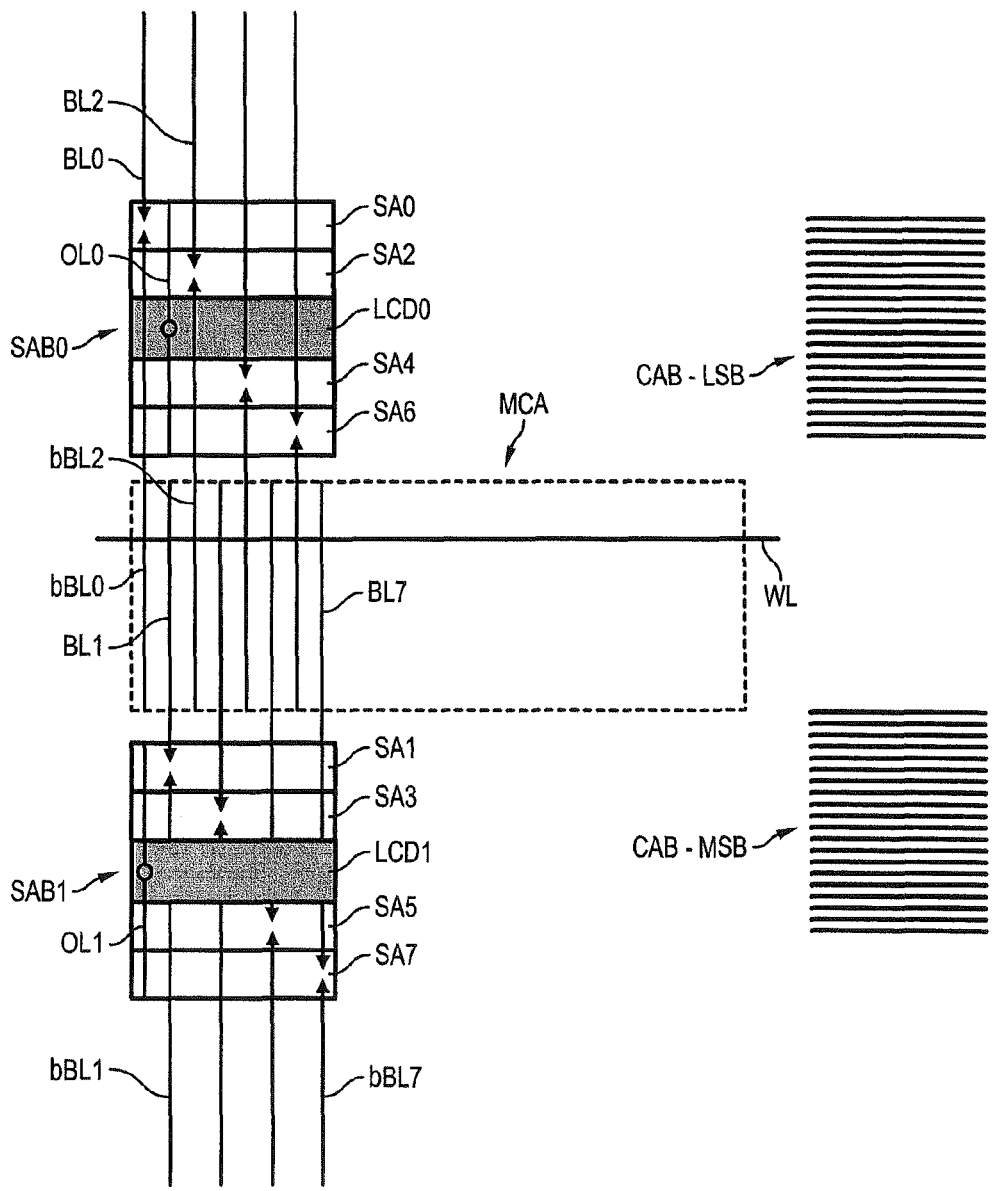
FIG. 3 schematically represents a DRAM according to an embodiment of the invention.

With reference to FIG. 3, the invention provides a semiconductor memory, in particular a DRAM, comprising a plurality of bit lines BL0, bBL0, BL1, bBL1, BL2, bBL2, ..., BL7, bBL7 and a plurality of wordlines WL crossing each other. The memory further comprises a memory cell array MCA formed by a plurality of memory cells arranged in rows and columns on crossover points of the bit lines and wordlines. The memory further comprises at least one pair of sense amplifier banks SAB0 SAB1, wherein the sense amplifier banks of a pair are arranged on opposite sides of the memory cell array MCA. Each sense amplifier bank of a pair comprises a plurality of sense amplifiers SA0, SA2, SA4, SA6; SA1, SA3, SA5, SA7 staggered in the longitudinal direction of the bit lines. The sense amplifier banks of a pair are laid out on opposite sides of the memory cell array MCA.

FIG. 3 represents a single pair of sense amplifier banks SAB0, SAB1, wherein each bank has four staggered sense amplifiers. It will be understood that the invention also applies to a larger number of pairs of sense amplifier banks, such as for instance 128 pairs, as well as to a different number of staggered sense amplifiers in a sense amplifier bank, such as for instance 2 or 8 staggered sense amplifiers.

Each sense amplifier is connected to a corresponding bit line according to an interleaved arrangement whereby bit lines alternate in the lateral direction of the wordlines between a bit line coupled to a sense amplifier of the first bank of the pair and a bit line coupled to a sense amplifier of the second bank of the pair. Taking bit lines bBL0, BL1 and bBL2 as examples of sequential bit lines in the wordline direction, bit line bBL0 is coupled to sense amplifier SA0 of the top sense amplifier bank SAB0, bit line BL1 is coupled to sense amplifier SA1 of the bottom sense amplifier bank SAB1, and bit line bBL2 is coupled to sense amplifier SA2 of the top sense amplifier bank SAB0. As a result of this interleaved arrangement, bit line BL1 does not run over the top sense amplifier bank SAB0, thereby leaving an interconnect space available between bit lines bBL0 and bBL2. Similarly, as bit lines bBL0 and bBL2 do not run over the bottom sense amplifier SAB1, interconnect spaces are available on each side of bit lines BL1, bBL1. More specifically, the available interconnect spaces are free spaces available for drawing metal-0 lines.

The invention further provides locally decoding the sense amplifiers by placing the logic of the column decoder within the sense amplifier banks. More specifically, each sense amplifier bank SAB0, SAB1 comprises at least one local column decoder LCD0, LCD1 for selecting at least one sense amplifier of the sense amplifier bank. The local column decoder LCD0, LCD1 is staggered with the sense amplifiers of the bank and is coupled to at least one sense amplifier of the bank by means of an output line OL0, OL1, typically a metal-0 line, running in an available interconnect space parallel to the bit lines, such as the interconnect space available between bit lines BL0 and BL2 over the top sense amplifier bank SAB0 for output line OL0 or the interconnect space available before bit line BL1 over the bottom sense amplifier bank SAB1 for output line OL1.

It will be noted that the pitch of the local column decoder is at most the pitch of a sense amplifier (8 memory columns in the illustrated example). In a preferred embodiment of the invention, the local column decoder is a multi-input logic gate, for instance a two-input gate, in particular a gate which generates a particular value from only a single combination of its inputs, such as a NOR or NAND logic gates. It will be noted that a NOR gate is typically implemented when the sense amplifiers have N type pass gates, while a NAND gate is implemented when the sense amplifiers have P type pass gates. As all dual input function meets the 8 column pitch, the layout is relatively easy.

Figure 6C:
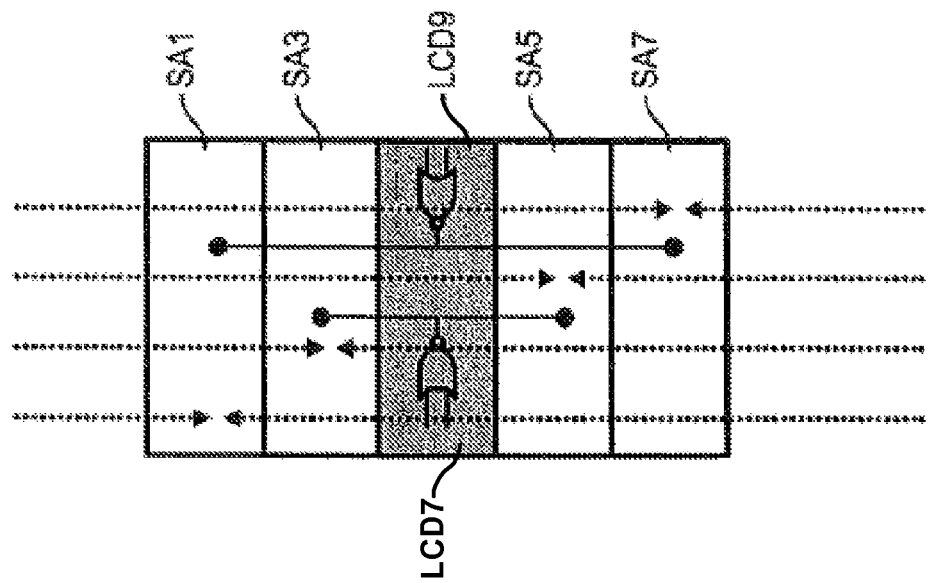
FIGS. 6a, 6b and 6c represent various possible embodiments of the invention.
Figure 6B:
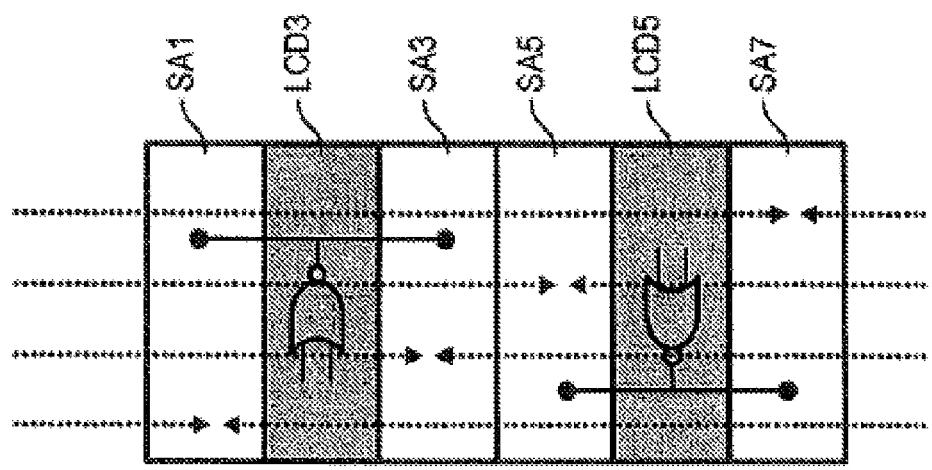
Figure 6A:
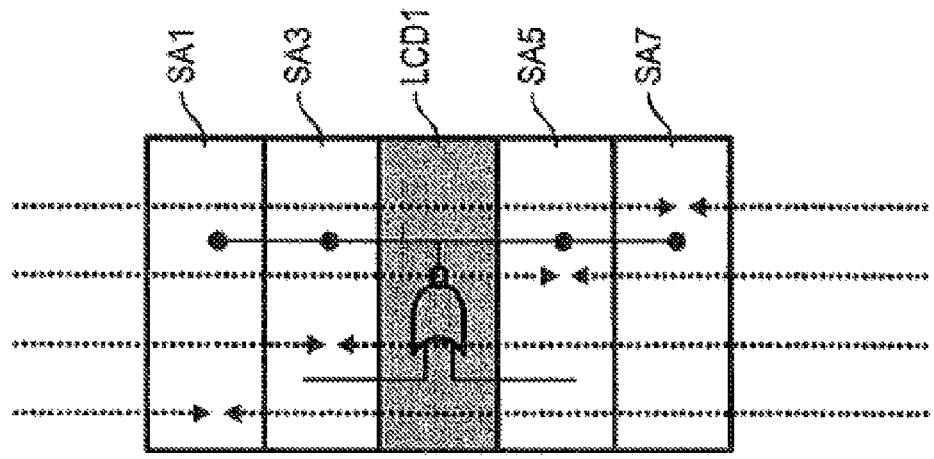

As shown in FIGS. 3 and 6a, a local column decoder, such as LCD1, can be coupled to all the sense amplifiers of the bank. When the bank counts four sense amplifiers as exemplified by these figures, the local column decoder LCD1 allows decoding the four sense amplifiers SA1, SA3, SA5, SA7: four consecutive bits of a same word therefore share the same address.

Preferably, the sense amplifier banks comprise an even number of staggered sense amplifiers, and the local column decoders are placed centrally in the bank so as to have an equal number of sense amplifiers of each of its sides.

Alternatively, a sense amplifier bank may comprise a plurality of local column decoders. A possible arrangement of a plurality of local column decoders within a sense amplifier bank is shown on FIG. 6b where a sense amplifier bank comprises two local column decoders LCD3, LCD5, where each local column decoder is coupled to half of the sense amplifiers of the bank. In the staggered arrangement of FIG. 6b, each local column decoder LCD3, LCD5 has two immediately adjacent sense amplifiers SA1, SA3; SA5, SA7 to which it is coupled. With this arrangement, two consecutive bits of a same word share the same address. But addresses of local column decoders could also be identical, so that four consecutive bits of a same world share the same address.

In another variant, a local column decoder may comprise a plurality of decoder sections, such as two-decoder sections LCD7, LCD9 as shown on FIG. 6c, each section being coupled to respective sense amplifiers. In the arrangement of FIG. 6c, the local column decoder is centrally arranged and comprises two sections. A first decoder section LCD9 of the local column decoder is coupled to the top and bottom sense amplifiers SA1, SA7, while a second decoder section LCD7 of the local column decoder is coupled to the intermediate sense amplifiers SA3, SA5. It will be noted that addresses of decoder sections can be the same or different depending upon the application. It will be understood that such an arrangement is possible only if the cumulative pitch of the decoder sections remain below the pitch of a sense amplifier (8 memory columns in the illustrated examples).

Figure 7:
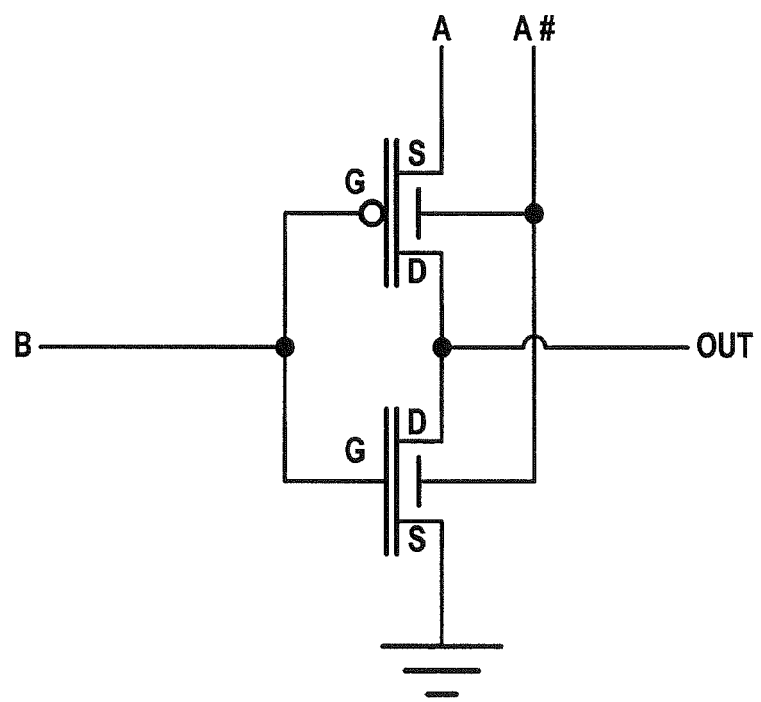
FIG. 7 represents a NOR gate on FDSOI that can be used as a local column decoder in a possible embodiment of the invention.

In this respect, it has to be noted that the Applicant has previously designed a NOR2 gate on FDSOI with only 2 transistors. Such a NOR2 gate can thus be drawn over only 4 memory columns. With such a design, two decoder sections can therefore be incorporated within a local column decoder staggered with sense amplifiers having the pitch of 8 memory columns. It will be appreciated that such a NOR2 FDSOI gate has been described in European patent application no. 10175849.8 filed on Sep. 8, 2010. This NOR2 FDSOI gate makes use of the pseudo-inverter structure shown in FIG. 7 which inputs are referenced A and B. The transistors of the pseudo-inverter structure are dual-gate FDSOI transistors having a front control gate and a back gate under the buried oxide layer SOI substrate, the back gates being controlled by a signal A# which is complementary to the input signal A applied to the source of the P-transistor. It will be appreciated that SOI FinFETs can also be used in place of such FDSOI transistors.

It will also be appreciated that the back gates of such a local column decoder can be used to boost a sense amplifier, in particular when the transistor drive of the sense amplifier is not sufficient to restore in time the data into the memory cell. This effect is further symmetrical on both sides of the sense amplifier and doesn't include mismatches.

FDSOI also proves advantageous in that FDSOI transistors exhibit less variability. Width and length of the transistors can be reduced as compared to an implementation of the invention on a bulk substrate, and the sense amplifier area can be divided by 2 to 2.5.

Figure 4:
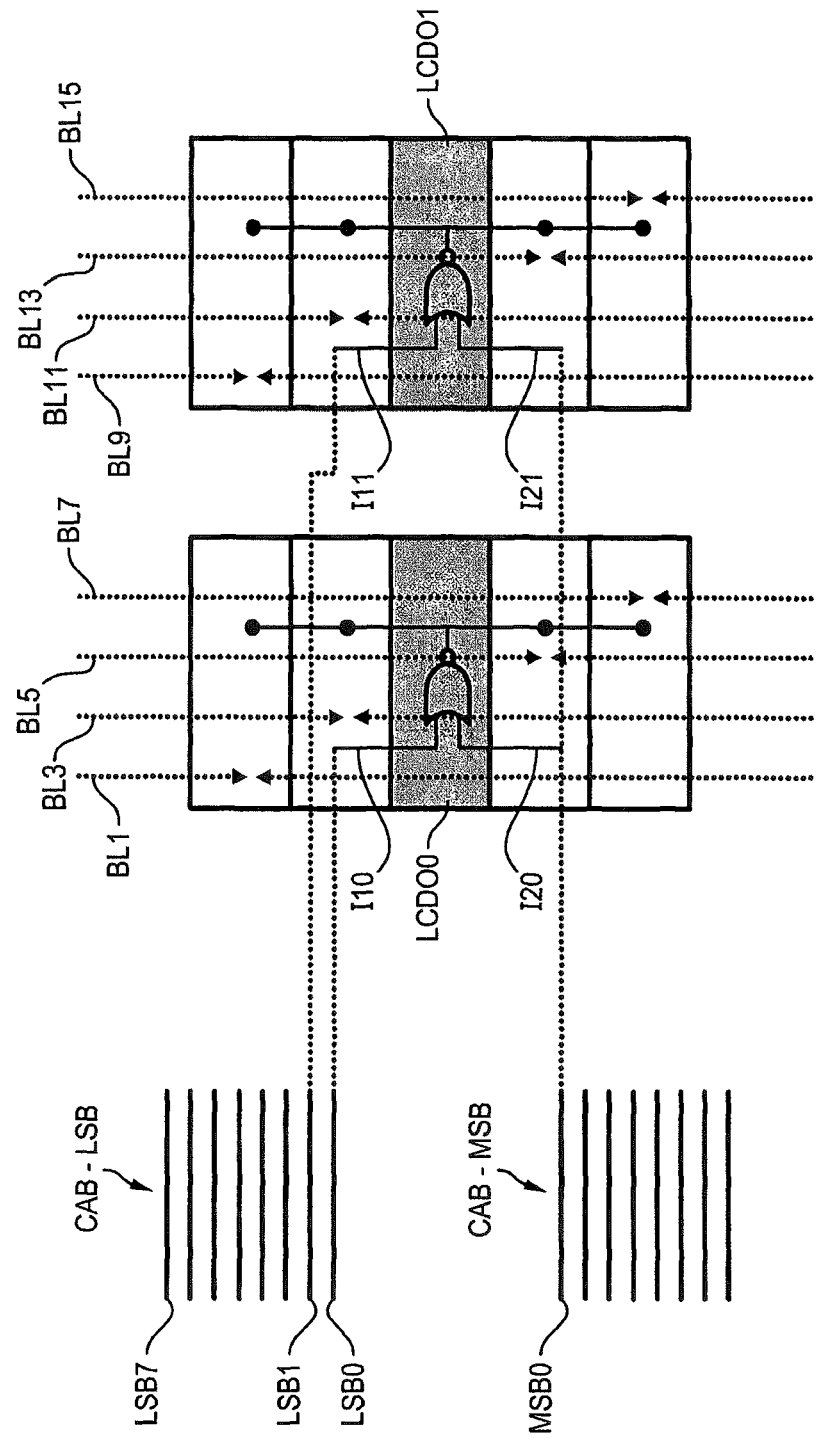
FIG. 4 represents the column addressing of a DRAM according to a first embodiment of the invention.

FIG. 4 shows two sense amplifiers banks, consecutive in the wordline direction. Each bank comprises a local column decoder LCD00, LCD01 centrally staggered and coupled to all the sense amplifiers of the bank. In the example of FIG. 4, each local column decoder is implemented as a dual-input NOR gate. A first input of the NOR gate is connected to a first column address bus CAB-LSB, for instance for addressing the least significant bits, by means of a first input line I10, I11 running in an available interconnect space. A second input of the NOR gate is connected to a second column address bus CAB-MSB, for instance for addressing the most significant bits, by means of a second input line I20, I21 running in another available interconnect space. The first and second input lines I10, I11 and I20, I21 are preferably metal-0 lines running in spaces left free by the bit lines.

Figure 1:
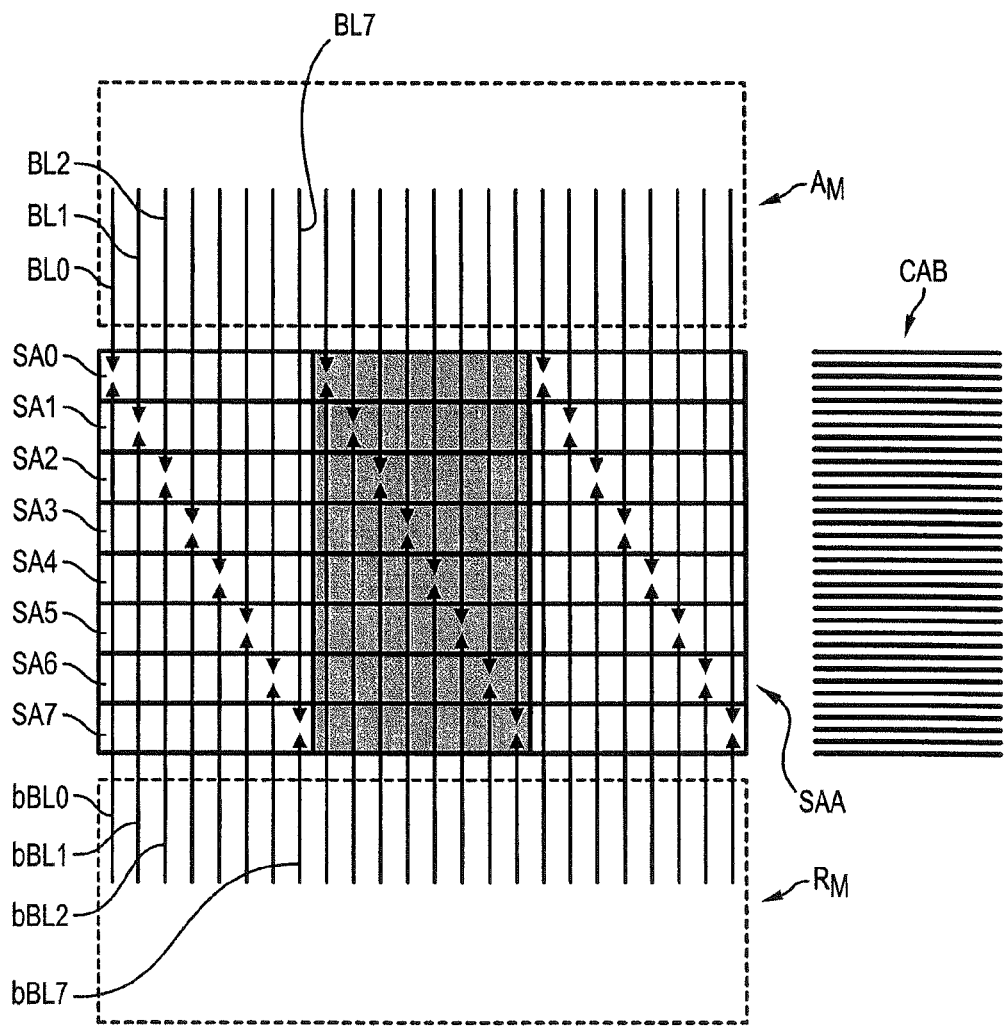
FIG. 1 shows a conventional DRAM architecture.
Figure 2:
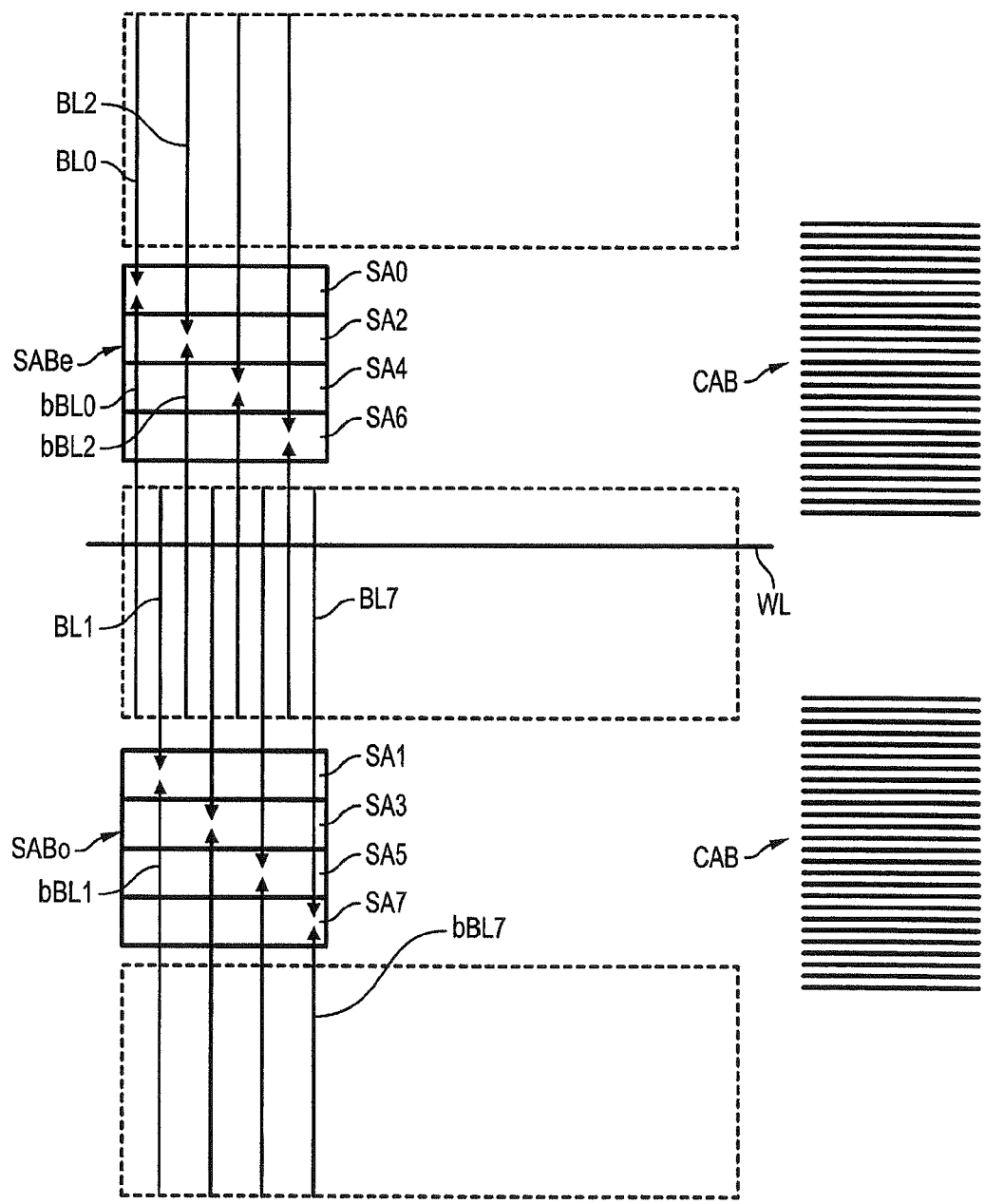
FIG. 2 shows another conventional DRAM architecture, wherein the bit lines are interleaved.

If the architecture of the conventional circuit initially required for instance 64 busses to decode each sense amplifier within a bank like on FIG. 1 or FIG. 2, then the new organization proposed by the invention requires only 16 busses CAB-LSB, CAB-MSB (8 least significant bits—LSB—and 8 most significant bits—LSB) to fulfil the same functionality. It will be appreciated that these buses CAB-LSB and CAB-MSB are coupled to a main column decoder configured to output column selection signals to corresponding local column decoders in the sense amplifier banks. These 16 buses correspond to around 40-45 metal-1 tracks, as compared to the 100 tracks necessary in the prior art architecture of FIG. 1. The bussing constraint is thus considerably minimized, and can be considered as equivalent to the transistor area constraint.

According a first embodiment represented in FIG. 4, the first and second column address busses CAB-LSB, CAB-MSB are metal-1 busses running in the transversal direction of the wordlines. The first MSB bus MSB0 is coupled to the first eight sense amplifiers banks consecutive in the wordline direction, while the LSB bus to which each of these eight banks is coupled is sequentially changed from the first LSB bus LSB0 until reaching the eighth LSB bus LSB7. Once the eight first sense amplifier banks have been addressed, the MSB bus then changes from the first MSB bus MSB0 to the second MSB bus MSB1, and all LSB buses LSB0-LSB7 are once again sequentially used. This process is repeated for the 64 sense amplifier banks.

Figure 5:
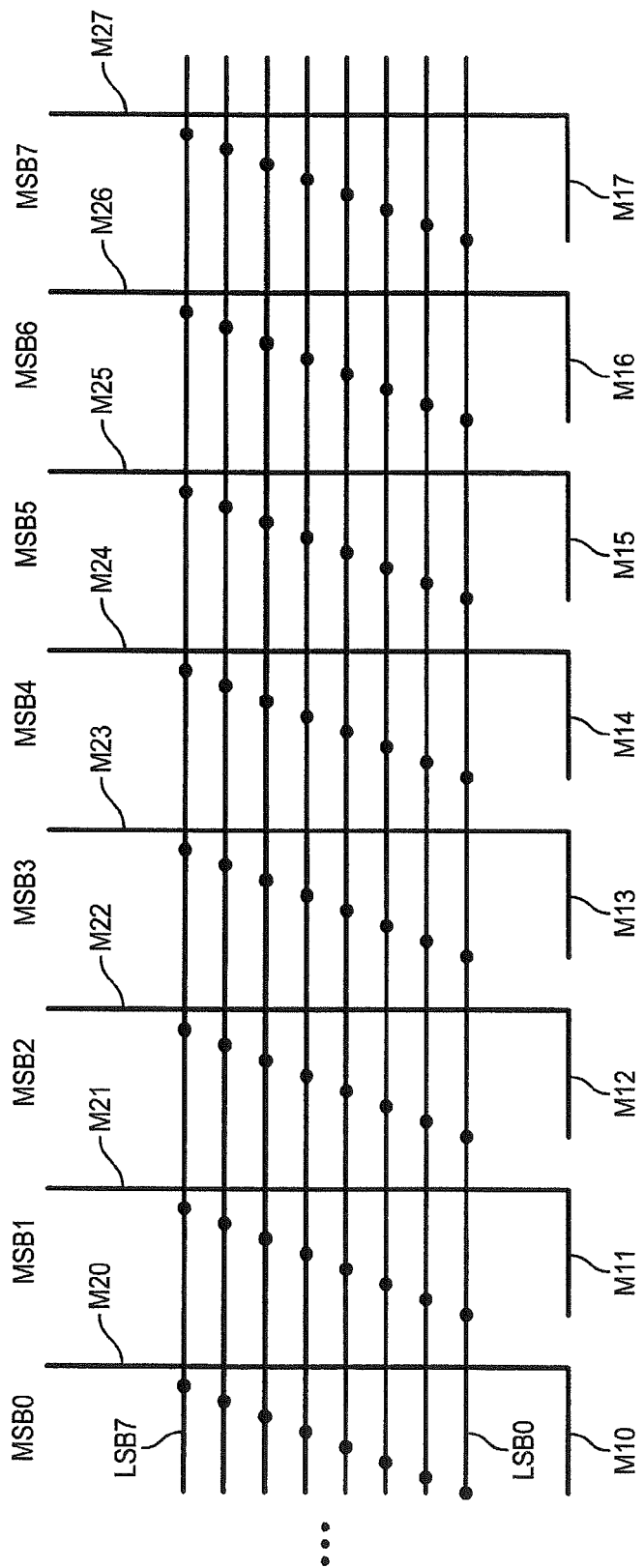
FIG. 5 represents the column addressing of a DRAM according to a second embodiment of the invention.

According to another embodiment represented in FIG. 5, the first column address busses CAB-LSB are metal-1 busses running in the transversal direction of the wordlines, while the second column address busses CAB-MSB comprises a set of metal-2 busses M20, M21, . . . , M27 running in the longitudinal direction of the bit lines, a metal-1 bus M10, M11, . . . , M17 running in the transversal direction of the wordlines being coupled to each metal-2 bus of the set.

In the embodiment of FIG. 5, metal-2 busses are spaced from each other by a distance corresponding to eight times the pitch of the sense amplifiers banks (64 memory cells). Metal-2 bus M20 and metal-1 bus M10 are used to address to the first eight sense amplifier banks, with the metal-1 bus M10 being coupled to the second input I21, I22 of the local column decoders of the eight first sense amplifier banks (as schematically represented by the dots on FIG. 5). Similarly, metal-2 bus M21 and metal-1 bus M11 are used to address the sense amplifier banks nine to sixteen, with the metal-1 bus M11 being coupled to the second input of the local column decoders of the sense amplifier banks number nine to sixteen. This process is repeated for the 64 sense amplifier banks.

The invention finally proves advantageous in that most of the column decoder circuitry can be integrated into the on-pitch area and no longer need to be in the periphery of the memory, i.e. it becomes an on-pitch circuit and thus becomes itself very small in area and has a much lower power consumption and a higher speed.

It will further be appreciated that the invention can be implemented on all technologies: e.g., in bulk, Pseudo Depleted Silicon On Insulator (PDSOI), or FDSOI material. As shown above, FDSOI enhances the advantages as it allows smaller transistors than bulk.

What is claimed is:

1. A semiconductor memory, comprising:
   a plurality of bit lines and a plurality of wordlines crossing each other, a memory cell array formed by a plurality of memory cells arranged in rows and columns on crossover points of the bit lines and wordlines,
   at least one pair of sense amplifier banks, arranged on opposite sides of the memory cell array, wherein each sense amplifier bank of a pair comprises a plurality of sense amplifiers staggered in a longitudinal direction of the bit lines, each sense amplifier being connected to a corresponding bit line according to an interleaved arrangement whereby bit lines alternate in a lateral direction of the wordlines between a bit line coupled to a sense amplifier of a first bank of the pair and a bit line coupled to a sense amplifier of a second bank of the pair, the alternative arrangement of the bit lines resulting in interconnect spaces available in each sense amplifier bank of the pair parallel to the bit lines, and
   at least one local column decoder for selecting at least one sense amplifier of the sense amplifier bank, the local column decoder being staggered with the sense amplifiers and being coupled to the at least one sense amplifier of the sense amplifier bank by means of an output line running in one of a plurality of available interconnect spaces parallel to the bit lines, wherein the available interconnect spaces are free spaces available between the bit lines and the available interconnect spaces are on the same metallization layer as the bit lines.

2. The semiconductor memory of claim 1, wherein each sense amplifier bank comprises a single local column decoder coupled to each sense amplifier of the sense amplifier bank.

3. The semiconductor memory of claim 1, wherein each sense amplifier bank comprises a plurality of local column decoders.

4. The semiconductor memory of claim 1, wherein the local column decoder is a NOR gate or a NAND gate.

5. The semiconductor memory of claim 1, wherein the local column decoder comprises a plurality of decoder sections, each decoder section being coupled to respective sense amplifiers of the sense amplifier bank.

6. The semiconductor memory of claim 1, wherein a first input of the local column decoder is connected to a first column address bus by means of a first input line, wherein a second input of the local column decoder is connected to a second column address bus by means of a second input line, and wherein both the first and the second input lines run in an available interconnect space.

7. The semiconductor memory of claim 6, wherein the first input line is a metal-0 line and the first column address bus is a metal-1 bus.

8. The semiconductor memory of claim 6, wherein the second input line is a metal-0 line and the second column address bus is a metal-1 bus.

9. The semiconductor memory of claim 6, wherein the second input line is a metal-0 line, and wherein the second column address bus comprises a metal-2 bus running in the longitudinal direction of the bit lines and a metal-1 bus coupled to the metal-2 bus, the metal-1 bus running in the transversal direction of the wordlines.

10. A semiconductor memory, comprising:
    a plurality of bit lines and a plurality of wordlines crossing each other,
    a memory cell array formed by a plurality of memory cells arranged in rows and columns on crossover points of the bit lines and wordlines,
    at least one pair of sense amplifier banks, arranged on opposite sides of the memory cell array, wherein each sense amplifier bank of a pair comprises a plurality of sense amplifiers staggered in a longitudinal direction of the bit lines, each sense amplifier being connected to a corresponding bit line according to an interleaved arrangement whereby bit lines alternate in a lateral direction of the wordlines between a bit line coupled to a sense amplifier of a first bank of the pair and a bit line coupled to a sense amplifier of a second bank of the pair, the alternative arrangement of the bit lines resulting in interconnect spaces available in each sense amplifier bank of the pair parallel to the bit lines, and
    at least one local column decoder coupled to multiple columns for selecting at least one sense amplifier of the sense amplifier bank, the local column decoder being staggered with the sense amplifiers and being coupled to the at least one sense amplifier of the sense amplifier bank by means of an output line running in one of a plurality of available interconnect spaces parallel to the bit lines, wherein the available interconnect spaces are free spaces available between the bit lines and the available interconnect spaces are on the same metallization layer as the bit lines.

11. The semiconductor memory of claim 10, wherein each sense amplifier bank comprises a single local column decoder coupled to each sense amplifier of the sense amplifier bank.

12. The semiconductor memory of claim 10, wherein each sense amplifier bank comprises a plurality of local column decoders.

13. The semiconductor memory of claim 10, wherein the local column decoder is a NOR gate or a NAND gate.

14. The semiconductor memory of claim 10, wherein the local column decoder comprises a plurality of decoder sections, each decoder section being coupled to respective sense amplifiers of the sense amplifier bank.

15. The semiconductor memory of claim 14, wherein the sense amplifier banks are implemented on a semiconductor-on-insulator substrate and wherein a decoder section comprises a pseudo-inverter structure having two complementary double-gate transistors in series between a first input of the decoder section and the ground, each double-gate transistor having a first gate and a second gate, the first gates of the transistors being both coupled to a second input of the decoder section while the second gates of the transistors are both coupled to the complementary of the first input, an output of the decoder section out being provided at the middle-point of the serial association of the two transistors.

16. The semiconductor memory of claim 10, wherein a first input of the local column decoder is connected to a first column address bus by means of a first input line, wherein a second input of the local column decoder is connected to a second column address bus by means of a second input line, and wherein both the first and the second input lines run in an available interconnect space.

17. The semiconductor memory of claim 16, wherein the first input line is a metal-0 line and the first column address bus is a metal-1 bus.

18. The semiconductor memory of claim 16, wherein the second input line is a metal-0 line and the second column address bus is a metal-1 bus.

19. The semiconductor memory of claim 16, wherein the second input line is a metal-0 line, and wherein the second column address bus comprises a metal-2 bus running in the longitudinal direction of the bit lines and a metal-1 bus coupled to the metal-2 bus, the metal-1 bus running in the transversal direction of the wordlines.

20. A semiconductor memory, comprising:
a plurality of bit lines and a plurality of wordlines crossing each other,
a memory cell array formed by a plurality of memory cells arranged in rows and columns on crossover points of the bit lines and wordlines,
at least one pair of sense amplifier banks, arranged on opposite sides of the memory cell array, wherein the sense amplifier banks are implemented on a semiconductor-on-insulator substrate, wherein each sense amplifier bank of a pair comprises a plurality of sense amplifiers staggered in a longitudinal direction of the bit lines, each sense amplifier being connected to a corresponding bit line according to an interleaved arrangement whereby bit lines alternate in a lateral direction of the wordlines between a bit line coupled to a sense amplifier of a first bank of the pair and a bit line coupled to a sense amplifier of a second bank of the pair, the alternative arrangement of the bit lines resulting in interconnect spaces available in each sense amplifier bank of the pair parallel to the bit lines, and
at least one local column decoder for selecting at least one sense amplifier of the sense amplifier bank, the local column decoder being staggered with the sense amplifiers and being coupled to the at least one sense amplifier of the sense amplifier bank by means of an output line running in an available interconnect space parallel to the bit lines, wherein a decoder section of the local column decoder comprises a pseudo-inverter structure having two complementary double-gate transistors in series between a first input of the decoder section and the ground, each double-gate transistor having a first gate and a second gate, the first gates of the transistors being both coupled to a second input of the decoder section while the second gates of the transistors are both coupled to the complementary of the first input, an output of the decoder section out being provided at the middle-point of the serial association of the two transistors.

* * * * *